(12) United States Patent
Partsch et al.

(10) Patent No.: US 6,760,261 B2
(45) Date of Patent: Jul. 6, 2004

(54) DQS POSTAMBLE NOISE SUPPRESSION BY FORCING A MINIMUM PULSE LENGTH

(75) Inventors: Torsten Partsch, Chapel Hill, NC (US); George William Alexander, Durham, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/254,305

(22) Filed: Sep. 25, 2002

(65) Prior Publication Data

US 2004/0056697 A1 Mar. 25, 2004

(51) Int. Cl.$^7$ ................................................ G11C 7/00
(52) U.S. Cl. ........................... 365/189.05; 365/230.08; 365/193
(58) Field of Search ................. 365/189.05, 193, 365/230.08, 233; 327/295, 296, 298, 299

(56) References Cited

U.S. PATENT DOCUMENTS

| 4,608,669 | A | * | 8/1986 | Klara et al. | ................. | 365/201 |
|---|---|---|---|---|---|---|
| 5,309,035 | A | * | 5/1994 | Watson, Jr. et al. | ........ | 327/141 |
| 6,275,441 | B1 | * | 8/2001 | Oh | ......................... | 365/230.04 |
| 6,552,957 | B2 | * | 4/2003 | Yagishita | ..................... | 365/233 |
| 2001/0039602 | A1 | * | 11/2001 | Kanda et al. | ............... | 711/105 |

* cited by examiner

Primary Examiner—Gene Auduong

(57) ABSTRACT

A circuit and method for suppressing the effect of noise on a data strobe signal DQS in a double data rate (DDR) SDRAM is provided. The circuit includes a data input latch circuit for receiving data to be stored and for latching the data in a memory array in response to a control signal; and a control signal generator for generating the control signal in response to a data strobe signal wherein the control signal has a predetermined minimum pulse width of the data strobe signal. The control signal generator includes a reset/set flip-flop for generating the control signal, wherein the flip-flop is set by the data strobe signal; and a low pass filter for receiving the data strobe signal and for outputting a reset signal to the flip-flop if the data strobe signal is greater than the predetermined minimum pulse width.

17 Claims, 3 Drawing Sheets

DQS POSTAMBLE NOISE SUPPRESSION BY FORCING A MINIMUM PULSE LENGTH

BACKGROUND OF THE INVENTION

1. Field of the Invention

The present invention relates generally to semiconductor memory devices, and more particularly, to a circuit and method for suppressing noise of a postamble data strobe signal (DQS) in a double data rate (DDR) synchronous dynamic random access memory (SDRAM).

2. Description of the Related Art

Synchronous dynamic random access memories (hereinafter, referred to as SDRAMs) have been developed for achieving a high speed of operation in DRAM devices. The SDRAM operates in synchronization with an external clock signal and includes a single data rate (SDR) SDRAM, a double data rate (DDR) SDRAM and the like.

The SDR SDRAM operates in synchronization with rising edges of the external clock, so that one data is processed within one period of the external clock. On the contrary, the DDR SDRAM operates in synchronization with rising and falling edges of a data strobe signal (DQS), so that two successive data are processed within one period of the external clock. Therefore, compared with the SDR SDRAM, the DDR SDRAM achieves at least twice the operation speed without increasing a frequency of the external clock.

FIG. 1(a) is a timing diagram illustrating an operation of a conventional DDR SDRAM. In DDR SDRAMs, data arrives centered to both edges of the DQS signal, i.e., a rising edge and a falling edge. The DQS signal can advance or trail a clock signal (VCLK), generated by an external clock, by up to +/−25% of the cycle time, i.e., tDQSSmin and tDQSSmax respectively. After the initial latching, the data is divided on separate data lines (SRWD) which direct the data further into a memory array according to the edge of the DQS signal they were originally centered to (even/odd data). With the falling edge of the DQS signal, the data is driven onto those separate data lines (SRWD). The data is driven into the memory array after being internally latched with the rising edge of a signal derived from a CAS (Column Address Strobe) signal (see Latchpoint in FIG. 1). This CAS signal is ignorant to the tDQSS value (a cycle period of the DQS signal). After the last valid DQS pulse, the DQS signal is not driven anymore and the system termination pulls the DQS signal into a tristate level, as shown in FIG. 1(a) at point A.

After the last valid DQS edge, an off-chip driver driving the DQS signal stops driving and the DQS signal is pulled from a postamble state, which is defined as a low DQS signal before data issues, into the tristate level. At this point, the DQS line is subject to noise from outside the chip or memory device, e.g., switching noise, ringing, etc. Referring to FIG. 1(b), in the case of tDQSSmin (Early DQS signal), noise on the DQS line can cause a false falling edge, possibly forcing invalid data (iDATA) onto the separate data lines (SRWDea) before the correct data can be latched with the rising edge of the CAS signal (see point B in FIG. 1(b)). Additionally, in the case of tDQSSmax (Late DQS signal) as shown in FIG. 1(c), noise can possibly force invalid data (iDATA) onto the separate data lines at point C, however, this will not effect the integrity of the data stored in the memory device since it occurs after the rising edge of the CAS signal and will not be latched into the memory array.

SUMMARY OF THE INVENTION

Accordingly, it is an aspect of the present invention to provide a circuit and method for storing data in a memory device which prevents noise from latching invalid data into a memory array of the memory device.

It is another aspect of the present invention to provide a circuit and method for storing data in a memory device which forces a data strobe signal to have a minimum pulse width effectively eliminating invalid data latched by unwanted noise.

According to one aspect of the present invention, a circuit for storing data in a memory device is provided including a data input latch circuit for receiving data to be stored and for latching the data in a memory array in response to a control signal; and a control signal generator for generating the control signal in response to a data strobe signal wherein the control signal has a predetermined minimum pulse width of the data strobe signal.

According to another aspect of the present invention, the control signal generator includes a reset/set flip-flop for generating the control signal, wherein the flip-flop is set by the data strobe signal; and a low pass filter for receiving the data strobe signal and for outputting a reset signal to the flip-flop if the data strobe signal is greater than the predetermined minimum pulse width. The control signal generator further includes a delay element coupled between the low pass filter and the flip-flop for delaying the resetting of the flip-flop for a period greater than the predetermined minimum pulse width.

In another aspect of the present invention, a method for storing data in a memory device includes the steps of receiving data on a data bus; latching the data from the data bus in response to a data strobe signal; and latching the data into a memory array in response to a control signal wherein the control signal has a predetermined minimum pulse width of the data strobe signal.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

Preferred embodiments of the present invention will be described herein below with reference to the accompanying drawings. In the following description, well-known functions or constructions are not described in detail since they would obscure the invention in unnecessary detail.

The present invention is directed to a circuit and method for suppressing the effect of noise on a postamble data strobe signal DQS in a double data rate (DDR) SDRAM. The present invention achieves this noise suppression by guaranteeing a predetermined minimum pulse width of the DQS signal. In this way, a falling edge of high frequency noise on the DQS signal, which would otherwise drive invalid data onto a data bus, is eliminated.

Figure 1:
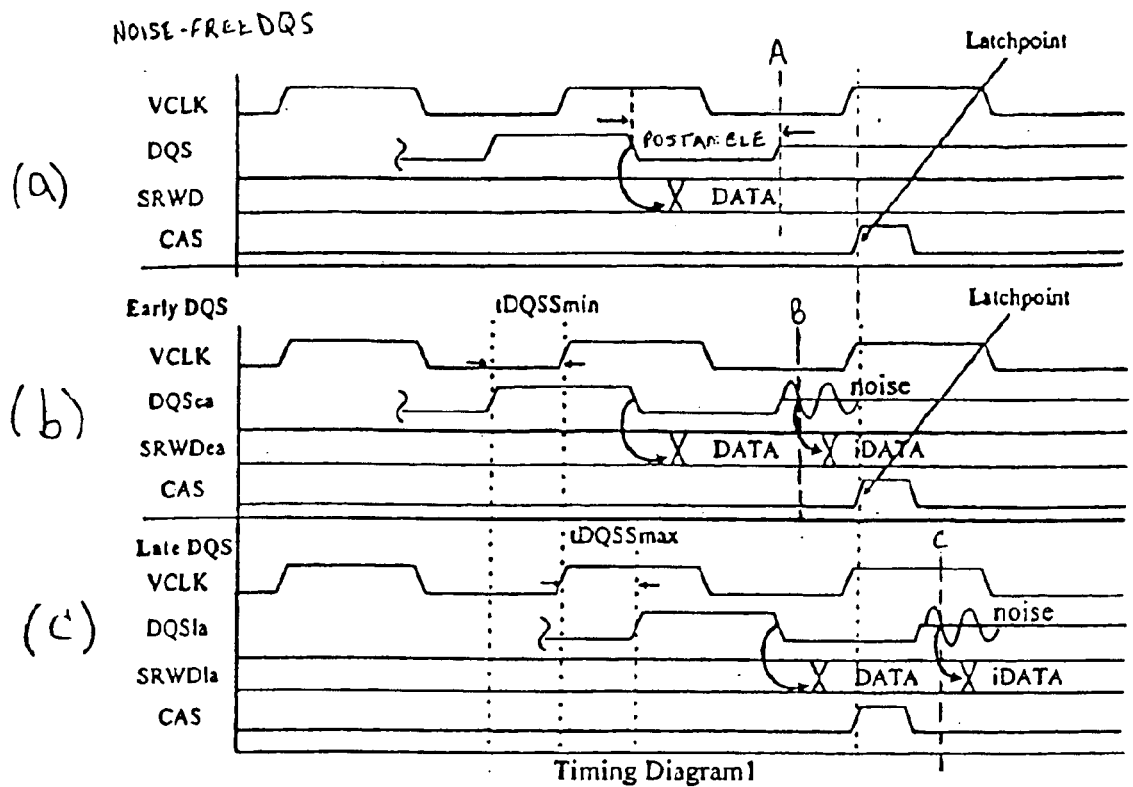
FIG. 1 is a timing diagram of an operation of a conventional double data rate (DDR) SDRAM.
Figure 2:
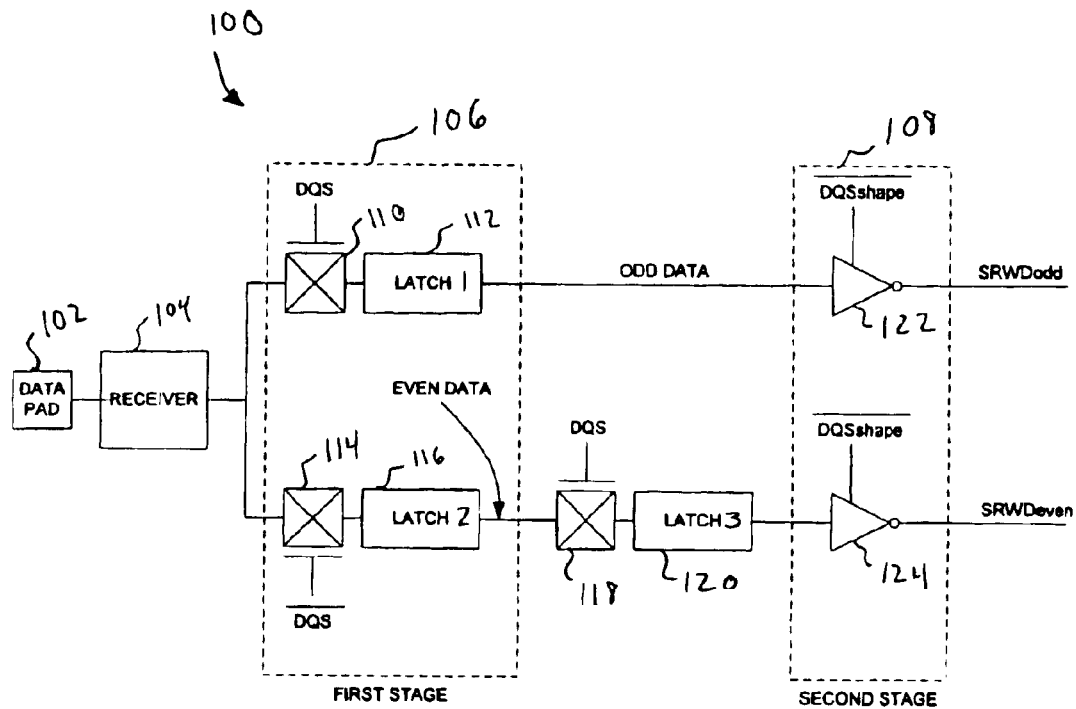
FIG. 2 is a data input latch circuit for a DDR SDRAM in accordance with the present invention.

Referring to FIG. 2, a data input latch circuit 100 of an embodiment of the present invention is provided. The data input latch circuit 100 includes a data pad 102 for coupling the circuit 100 to a data bus, a receiver 104 for receiving data from an external source, a first stage circuit 106 for latching the received data and a second stage circuit 108 for latching the data into a memory array (not shown) of the DDR SDRAM. The first stage circuit 106 includes a first transfer gate 110 and a first latch 112 for latching odd data from the receiver 104 and a second transfer gate 114 and second latch 116 for latching even data from the receiver 104. The second stage circuit 108 includes a first tri-state inverter 122 for latching the odd data into the memory array and a second tri-state inverter 124 for latching the even data into the memory array. Additionally, the data input latch circuit 100 includes a third transfer gate 118 and third latch 120 for latching the even data from the first stage circuit 106 to the second stage circuit 108.

The first stage circuit 106 is controlled by an original data strobe signal DQS. The second stage circuit 108 is controlled by a control signal DQSshape generated by a control signal generator, which will be described in detail below with reference to FIG. 3. The control signal DQSshape is the data strobe signal DQS with a minimum pulse width imposed upon it. This shaped DQS signal (DQSshape) is used in the second stage 108 of the DDR SDRAM data input latch circuit to prevent invalid data from being latched, while the first stage 106 of the data input latch circuit uses the original DQS signal to not compromise the input timing of the data.

Figure 3:
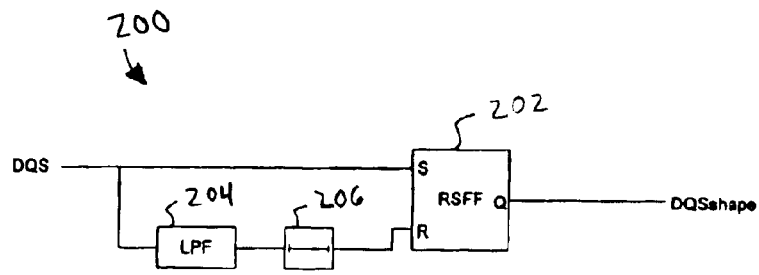
FIG. 3 is a control signal generator for supplying a data strobe signal (DQS) to the data input latch circuit of FIG. 2 in accordance with the present invention.
Figure 4:
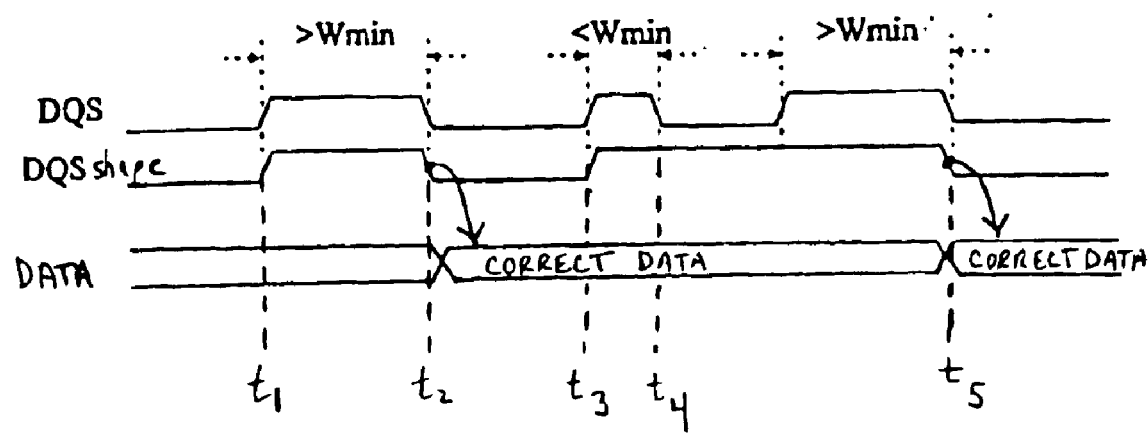
FIG. 4 is a timing diagram of a DDR SDRAM in accordance with the present invention.

Referring to FIG. 3, the control signal generator 200 includes a reset/set flip-flop 202, a low pass filter 204, and a delay element 206. The control signal generator 200 reshapes the original DQS signal to force a minimum pulse width on the control signal DQSshape. The original DQS pulse sets the reset/set flip-flop 202. Then, the DQS pulse is routed through the low pass filter (LPF) 204 and delay element (DE) 206 to generate the reset pulse at the reset/set flip-flop 202. The low pass filter 204 is used to suppress every DQS high pulse that is shorter than a predetermined minimum pulse width (Wmin), as shown in FIG. 4. The minimum pulse width Wmin is selected to be slightly shorter than a minimum pulse width of the original DQS signal at the highest specified frequency to be able to eliminate the noise but not the valid DQS pulses. The delay element 206 is used to delay the resetting of the flip-flop 202 to generate the minimum pulse width of the output signal DQSshape. If a pulse on the DQS line is shorter than Wmin, the signal DQSshape stays in a logical high state until a reset signal is generated from a valid DQS pulse. Thus, no invalid data is written onto the data bus.

In a further embodiment of the control signal generator, the low pass filter 204 and delay element 206 can be substituted with a weak-sized buffer (inverter) chain. The buffer chain may include a plurality of buffers, a plurality of inverters or a combination of buffers and inverters Preferably, the buffer chain is sized such that any signal pulse shorter than the predetermined minimum pulse width Wmin is suppressed while still adding the desired delay to reset flip-flop 202 at a time to generate the control signal DQSshape with the predetermined minimum pulse width Wmin.

Briefly, an operation of the data input latch circuit 100 will be described in relation to the timing diagram of FIG. 4. As data is received by the data pad 102 and receiver 104, odd data is latched into first latch 112 upon a rising edge of the DQS signal, at a time $t_1$, via the first transfer gate 110, even data is latched into second latch 116 upon a falling edge of the DQS signal, at a time $t_2$, via the second transfer gate 114 and, upon a subsequent rising edge of the original DQS signal at time $t_3$, the even data is latched into the third latch 120 via transfer gate 118. Additionally, the rising edge of the DQS signal sets flip-flop 202 of the control signal generator 200 to generator control signal DQSshape, time $t_1$, and the DQS signal is sent to the low pass filter 204. If the DQS is larger than the predetermined minimum pulse width Wmin, the low pass filter 204 pass the DQS to the delay element which subsequently resets the flip-flop 202 to output $\overline{\text{DQSshape}}$, i.e., a falling edge of DQS-shape at time $t_2$. DQSshape is then applied to the first and second tristate inverters 122, 124 to latch the odd and even data to the memory array.

Alternatively, if the DQS signal is less than the minimum pulse width Wmin (time $t_4$), the low pass filter will not let the DQS signal pass and the flip-flop 202 will remain set outputting DQSshape. When a valid DQS signal is generated at time $t_5$, the flip-flop 202 will be reset as described above outputting $\overline{\text{DQSshape}}$ and subsequently latching correct data unto the data bus.

While the invention has been shown and described with reference to certain preferred embodiments thereof, it will be understood by those skilled in the art that various changes in form and detail may be made therein without departing from the spirit and scope of the invention as defined by the appended claims.

What is claimed is:

1. A circuit for storing data in a memory device comprising:
   a data input latch circuit for receiving data to be stored and for latching the data in a memory array in response to a control signal; and
   a control signal generator for receiving a data strobe signal having pulses, each of the pulses having an actual pulse width, and for generating the control signal in response to the received data strobe signal, wherein the control signal has a predetermined minimum pulse width of the data strobe signal, the control signal generator being operable to generate, responsive to a received pulse of the data strobe signal having an actual pulse width below the predetermined pulse width of the data strobe signal, a pulse of the control signal having a pulse width greater than or equal to the predetermined minimum pulse width of the data strobe signal.

2. The circuit as in claim 1, wherein the control signal generator comprises:
   a reset/set flip-flop for generating the control signal, wherein the flip-flop is set by the data strobe signal; and
   a low pass filter for receiving the data strobe signal and for outputting a reset signal to the flip-flop if the data strobe signal is greater than or equal to the predetermined minimum pulse width.

3. The circuit as in claim 2, wherein the control signal generator further includes a delay element coupled between the low pass filter and the flip-flop for delaying the resetting of the flip-flop for a period greater than or equal to the predetermined minimum pulse width.

4. The circuit as in claim 1, wherein the control signal generator comprises:
   a reset/set flip-flop for generating the control signal, wherein the flip-flop is set by the data strobe signal; and
   a buffer chain for receiving the data strobe signal and for outputting a reset signal to the flip-flop, wherein the buffer chain is operable to delays the reset signal for a period greater than or equal to the predetermined minimum pulse width.

5. The circuit as in claim 4, wherein the buffer chain includes a plurality of inverters.

6. The circuit as in claim 4, wherein the buffer chain includes at least one buffers and at least one inverter.

7. The circuit as in claim 1, wherein the data input latch circuit includes a first stage circuit for latching the received data in response to the data strobe signal and a second stage circuit for latching the received data into the memory array in response to the control signal.

8. The circuit as in claim 7, wherein the first stage circuit includes a first transfer gate and first latch for latching odd data in response to a rising edge of the data strobe signal.

9. The circuit as in claim 8, wherein the second stage circuit includes a second transfer gate and second latch for latching even data in response to a falling edge of the data strobe signal.

10. The circuit as in claim 9, further comprising a third transfer gate and third latch for latching even data from the first stage circuit to the second stage circuit.

11. The circuit as in claim 7, wherein the second stage circuit includes a first tristate inverter for latching odd data from the first stage circuit in response to a falling edge of the control signal.

12. The circuit as in claim 11, wherein the second stage circuit includes a second tristate inverter for latching even data from the first stage circuit in response to a falling edge of the control signal.

13. A method for storing data in a memory device comprising the steps of:

receiving data on a data bus;

latching the data from the data bus in response to a data strobe signal;

generating a control signal in response to the data strobe signal such that the control signal has a predetermined minimum pulse width of the data strobe signal, wherein responsive to a pulse of the data strobe signal having an actual pulse width below the predetermined guise width of the data strobe signal, a pulse of the control signal having a pulse width greater than or equal to the predetermined minimum pulse width of the data strobe signal is generated; and latching the data into a memory array in response to the control signal.

14. The method as in claim 13, wherein the latching the data from the data bus step further comprises:

latching odd data in response to a rising edge of the data strobe signal; and latching even data in response to a falling edge of the data strobe signal.

15. The method as in claim 13, wherein the latching the data into a memory array step is performed in response to a falling edge of the control signal.

16. The method as in claim 13, wherein the control signal is generated by a control signal generator comprising:

a reset/set flip-flop for generating the control signal, wherein the flip-flop is set by the data strobe signal; and a low pass filter for receiving the data strobe signal and for outputting a reset signal to the flip-flop if the data strobe signal is greater than or equal to the predetermined minimum pulse width.

17. The circuit as in claim 16, wherein the control signal generator further includes a delay element coupled between the low pass filter and the flip-flop for delaying the resetting of the flip-flop for a period greater than or equal to the predetermined minimum pulse width.

* * * * *